US011250803B2

(12) United States Patent
Han et al.

(10) Patent No.: US 11,250,803 B2
(45) Date of Patent: Feb. 15, 2022

(54) DISPLAY DEVICE WITH THROUGH HOLE

(71) Applicant: LG Display Co., Ltd., Seoul (KR)

(72) Inventors: Jung-Woo Han, Cheongju-si (KR); Jin-Woo Park, Daegu (KR); Kwang-Hyun Baek, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/940,053

(22) Filed: Jul. 27, 2020

(65) Prior Publication Data

US 2021/0036022 A1    Feb. 4, 2021

(30) Foreign Application Priority Data

Jul. 29, 2019  (KR) .................. 10-2019-0091550

(51) Int. Cl.
*G09G 3/36* (2006.01)
*G02F 1/1362* (2006.01)
(Continued)

(52) U.S. Cl.
CPC ..... *G09G 3/3648* (2013.01); *G02F 1/136286* (2013.01); *G09G 3/3607* (2013.01);
(Continued)

(58) Field of Classification Search
CPC ......... G02F 1/136286; G02F 1/134309; H01L 27/124; H01L 27/3276; G09G 3/3614;
(Continued)

(56) References Cited

U.S. PATENT DOCUMENTS 9,685,131 B2   6/2017 Tanaka et al.
10,297,655 B2  5/2019 Ka et al.
(Continued)

FOREIGN PATENT DOCUMENTS

CN   107293567 A   10/2017
CN   108806513 A   11/2018
(Continued)

OTHER PUBLICATIONS

Taiwan Intellectual Property Office, Office Action, TW Patent Application No. 109123911, May 25, 2021, six pages.
(Continued)

*Primary Examiner* — Xuemei Zheng
(74) *Attorney, Agent, or Firm* — Fenwick & West LLP

(57) ABSTRACT

Disclosed is a display device including a panel including an active area in which a plurality of subpixels is disposed, a through hole formed through the active area of the panel, a hole bezel zone disposed between the through hole and the active area so as to surround the through hole, and a plurality of data lines extending from a first active area of the active area to a second active area of the active area via the hole bezel zone, the plurality of data lines having a smaller wire pitch in the hole bezel zone than in the first active area and the second active area, wherein a first arrangement sequence of the plurality of data lines disposed in the first active area and a second arrangement sequence of the plurality of data lines disposed in the hole bezel zone are different from each other.

15 Claims, 15 Drawing Sheets

(51) Int. Cl.
*H01L 27/12* (2006.01)
*G02F 1/1335* (2006.01)
*G02F 1/1333* (2006.01)

(52) U.S. Cl.
CPC ......... *G09G 3/3688* (2013.01); *H01L 27/124* (2013.01); *G02F 1/133302* (2021.01); *G02F 1/133512* (2013.01); *G09G 2300/0823* (2013.01); *G09G 2320/04* (2013.01); *H01L 27/1218* (2013.01)

(58) Field of Classification Search
CPC ... G09G 2300/0823; G09G 2300/0426; G09G 2310/0297; G09G 2320/0209; G09G 3/3607; G09G 3/3648
See application file for complete search history.

(56) References Cited

U.S. PATENT DOCUMENTS

| | | | |
|---|---|---|---|
| 10,700,155 B2 | 6/2020 | Ka et al. | |
| 10,854,705 B2 | 12/2020 | Ka et al. | |
| 11,048,294 B2 | 6/2021 | Yin et al. | |
| 2016/0019856 A1 | 1/2016 | Tanaka et al. | |
| 2017/0154566 A1 | 6/2017 | Ryoo et al. | |
| 2017/0294502 A1* | 10/2017 | Ka | H01L 27/3258 |
| 2019/0051670 A1 | 2/2019 | Bei et al. | |
| 2019/0074346 A1 | 3/2019 | Ka et al. | |
| 2019/0206894 A1 | 7/2019 | Lee et al. | |
| 2019/0245029 A1 | 8/2019 | Ka et al. | |
| 2020/0117034 A1 | 4/2020 | Yin et al. | |
| 2020/0144352 A1* | 5/2020 | Lee | H01L 27/3248 |
| 2020/0242996 A1* | 7/2020 | Wang | G09G 3/20 |
| 2020/0312944 A1 | 10/2020 | Ka et al. | |
| 2020/0342802 A1* | 10/2020 | Zou | H01L 27/3213 |
| 2021/0057515 A1 | 2/2021 | Ka et al. | |

FOREIGN PATENT DOCUMENTS

| | | |
|---|---|---|
| CN | 108831368 A | 11/2018 |
| CN | 108885376 A | 11/2018 |
| CN | 109491165 A | 3/2019 |
| CN | 110047901 A | 7/2019 |
| JP | 2005-046352 A | 2/2005 |
| WO | WO 2014/142183 A1 | 9/2014 |

OTHER PUBLICATIONS

Intellectual Property Office of the United Kingdom, Office Action, GB Patent Application No. 2010817.1, Jan. 13, 2021, six pages.
Japan Patent Office, Notice of Reasons for Refusal, JP Patent Application No. 2020-125046, Jul. 20, 2021, eight pages.

* cited by examiner

DISPLAY DEVICE WITH THROUGH HOLE

CROSS-REFERENCE TO RELATED APPLICATIONS

This application claims the benefit of Republic of Korea Patent Application No. 10-2019-0091550, filed on Jul. 29, 2019, which is hereby incorporated by reference as if fully set forth herein.

BACKGROUND

Field

The present disclosure relates to a display device having a through hole disposed in an active area.

Discussion of the Related Art

At least one optical module, such as a camera module or a sensor module, is mounted in an electronic device, such as a smartphone or a tablet personal computer (PC), together with a display device.

In general, each optical module is disposed in a through hole formed through a bezel unit of the electronic device.

With a decrease in size of the bezel unit, however, there is a need for a structure in which the optical module as well as the through hole is disposed in an active area of the display device. There is a need for a wiring structure changed such that, when the through hole is disposed in the active area of the display device, deterioration in image quality due to the through hole is prevented.

SUMMARY

Accordingly, the present disclosure is directed to a display device that substantially obviates one or more problems due to limitations and disadvantages of the related art.

An object of the present disclosure is to provide a display device capable of preventing deterioration in image quality due to a through hole.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device includes a panel including an active area in which a plurality of subpixels are disposed, a through hole formed through the active area of the panel, a hole bezel zone disposed between the through hole and the active area so as to surround the through hole, and a plurality of data lines extending from a first active area of the active area to a second active area of the active area via the hole bezel zone, the plurality of data lines having a smaller wire pitch in the hole bezel zone than in the first active area and the second active area, wherein a first arrangement sequence of the plurality of data lines disposed in the first active area and a second arrangement sequence of the plurality of data lines disposed in the hole bezel zone are different from each other.

The hole bezel zone may include a first bridge area disposed at an input end of the hole bezel zone adjacent to the first active area to change the first arrangement sequence of the plurality of data lines to the second arrangement sequence and a second bridge area disposed at an output end of the hole bezel zone adjacent to the second active area to change the second arrangement sequence of the plurality of data lines to the first arrangement sequence.

The plurality of data lines may be time-division-driven by a demultiplexer array mounted in the panel, and the second arrangement sequence of the plurality of data lines in the hole bezel zone may be set such that data lines among the time-division-driven data lines, which have identical drive timing and to which data signals having opposite polarities are applied, are disposed adjacent to each other.

The plurality of data lines may include data lines of a first metal layer and data lines of a second metal layer disposed in the hole bezel zone, the data lines of the first metal layer and the data lines of the second metal layer being alternately disposed.

Adjacent data lines of the first metal layer disposed adjacent to each other in the state in which the data lines of the second metal layer are disposed therebetween in the hole bezel zone may have the identical drive timing and may be applied with the data signals having opposite polarities.

Adjacent data lines of the second metal layer disposed adjacent to each other in the state in which the data lines of the first metal layer are disposed therebetween in the hole bezel zone may have the identical drive timing and may apply the data signals having opposite polarities.

The data signals applied to the adjacent data lines may be data signals of an identical color.

Data lines that are applied with green data signals in the hole bezel zone may be applied with data signals having an identical polarity by two adjacent data lines.

An arrangement sequence of the plurality of data lines may be changed such that the plurality of data lines has the first arrangement sequence in which first to twelfth data lines are sequentially arranged in each of the first and second active areas and such that the plurality of data lines has the second arrangement sequence in which the data lines are arranged in order of the first, second, fourth, third, fifth, sixth, seventh, eleventh, tenth, twelfth, eighth, and ninth data lines in the hole bezel zone.

The plurality of data lines may be time-division-driven at a ratio of 1:3 during each horizontal period. In the hole bezel zone, during each horizontal period, for a first time, a first data line and a fourth data line disposed adjacent to each other in an identical layer may supply first and second red data signals having opposite polarities, respectively, and a seventh data line and a tenth data line disposed adjacent to each other in an identical layer may supply third and fourth red data signals having opposite polarities, respectively. During each horizontal period, for a second time, a second data line and a fifth data line disposed in different layers may supply first and second green data signals having opposite polarities, respectively, and an eleventh data line and an eighth data line disposed in different layers may supply fourth and third green data signals having opposite polarities, respectively, the polarities of the second green data signal and the fourth green data signal being identical. During each horizontal period, for a third time, a third data line and a sixth data line disposed adjacent to each other in an identical layer may supply first and second blue data signals having opposite polarities, respectively, and a twelfth data line and a ninth data line disposed adjacent to each other in an identical layer may supply fourth and third blue data signals having opposite polarities, respectively.

The plurality of data lines may be time-division-driven at a ratio of 1:6 during each horizontal period. In the hole bezel zone, during each horizontal period, for a first time, a first data line and a fourth data line disposed adjacent to each other in an identical layer may supply first and second red data signals having opposite polarities, respectively. During each horizontal period, for a second time, a second data line and a fifth data line disposed in different layers may supply first and second green data signals having opposite polarities, respectively. During each horizontal period, for a third time, a third data line and a sixth data line disposed adjacent to each other in an identical layer may supply first and second blue data signals having opposite polarities, respectively. During each horizontal period, for a fourth time, a seventh data line and a tenth data line disposed adjacent to each other in an identical layer may supply third and fourth red data signals having opposite polarities, respectively. During each horizontal period, for a fifth time, an eleventh data line and an eighth data line disposed in different layers may supply fourth and third green data signals having opposite polarities, respectively. During each horizontal period, for a sixth time, a twelfth data line and a ninth data line disposed adjacent to each other in an identical layer may supply fourth and third blue data signals having opposite polarities, respectively.

Each of the first and second bridge areas may further include a first bridge electrode configured to interconnect the third data line extending from the active area and the third data line having the changed arrangement sequence in the hole bezel zone, a second bridge electrode configured to interconnect the eighth data line extending from the active area and the eighth data line having the changed arrangement sequence in the hole bezel zone, a third bridge electrode configured to interconnect the ninth data line extending from the active area and the ninth data line having the changed arrangement sequence in the hole bezel zone, and a fourth bridge electrode configured to interconnect the eleventh data line extending from the active area and the eleventh data line having the changed arrangement sequence in the hole bezel zone.

The hole bezel zone may include an outer circumferential region in which a plurality of gate lines extending from a third active area of the active area to a fourth active area of the active area via the hole bezel zone are disposed and an inner circumferential region in which curved parts of the plurality of data lines are disposed along the through hole between the outer circumferential region and the through hole, and the first bridge area may be disposed between the first active area and the outer circumferential region and the second bridge area may be disposed between the second active area and the outer circumferential region.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the invention and together with the description serve to explain the principle of the disclosure.

DETAILED DESCRIPTION

Hereinafter, preferred embodiments of the present disclosure will be described with reference to the accompanying drawings.

Figure 1A:
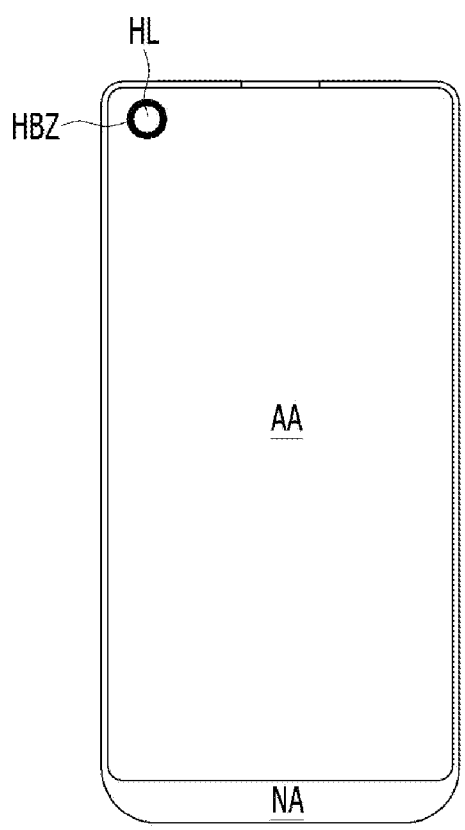
FIGS. 1A and 1B are views showing the structure of a display surface of a display device according to an embodiment of the present disclosure.
Figure 1B:
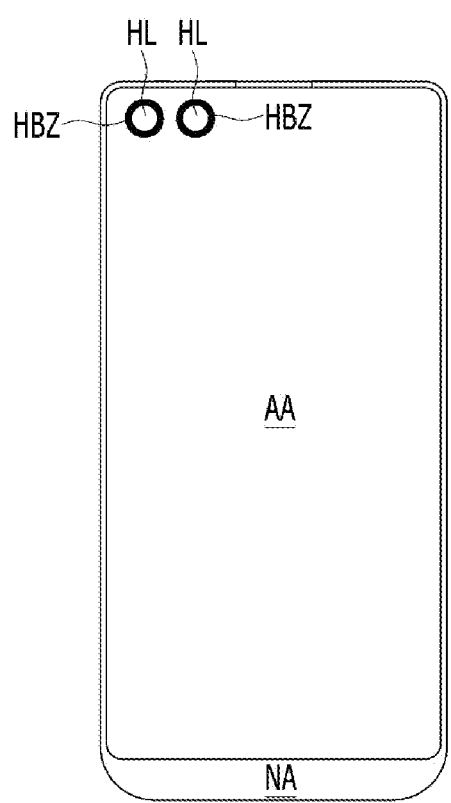
Figure 2A:
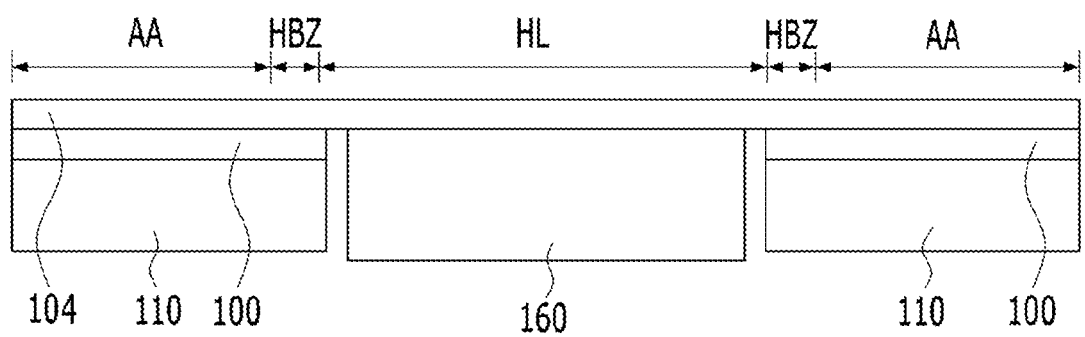
FIGS. 2A and 2B are sectional views showing a structure in which a camera module is inserted into a through hole of the display device according to the embodiment of the present disclosure.
Figure 2B:
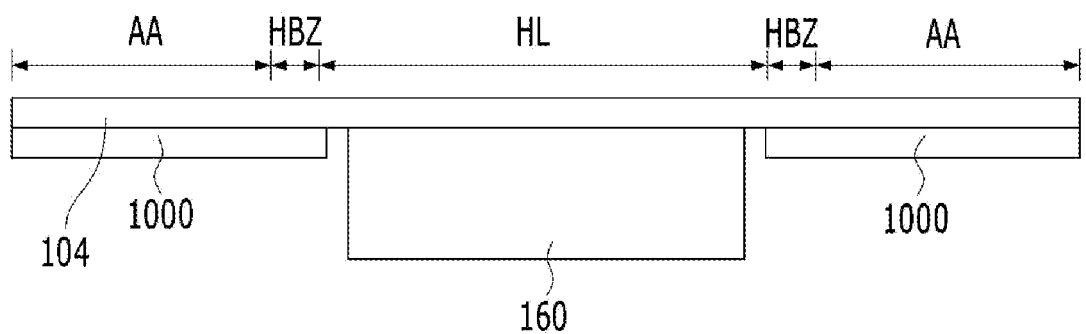

FIGS. 1A and 1B are views showing the structure of a display surface of a display device according to an embodiment of the present disclosure, and FIGS. 2A and 2B are sectional views showing a structure in which a camera module is inserted into a through hole of the display device according to the embodiment of the present disclosure.

Referring to FIGS. 1A and 1B, the display device according to the embodiment of the present disclosure includes an active area AA, in which a plurality of subpixels are disposed, and a non-active area NA, in which no subpixel is disposed, the non-active area NA surrounding the active area AA. The active area AA may be referred to as a display area or a pixel array area, and the non-active area NA may be referred to as a non-display area or a bezel area. The display device may further include a touchscreen configured to overlap the entirety of the active area AA in order to sense touch input.

The display device includes at least one through hole HL formed through the active area AA and at least one hole bezel zone HBZ disposed between each through hole HL and the active area AA. For example, the display device according to the embodiment of the present disclosure may include a through hole HL formed through the active area AA and a hole bezel zone HBZ, as shown in FIG. 1A, or may include a plurality of through holes HL formed through the active area AA and a plurality of hole bezel zones HBZ surrounding the plurality of through holes HL, as shown in FIG. 1B. The number of through holes HL disposed in the active area AA may be changed as needed.

Each hole bezel zone HBZ is a zone which has a structure surrounding a corresponding through hole HL, which has a structure surrounded by subpixels of the active area AA, and in which no subpixel is disposed. Each hole bezel zone HBZ is a part through which a plurality of wires extending from a portion to another portion of the active area AA passes, and the wires disposed in the hole bezel zone HBZ have a narrower wire pitch than in the active area AA. In order to compensate for a capacitance coupling effect due to the narrower wire pitch in the hole bezel zone HBZ, a hole bezel zone HBZ according to an embodiment of the present disclosure has a wire arrangement structure (sequence) different from the active area AA, a detailed description of which will follow.

An optical module may be inserted into and mounted in each through hole HL formed through the active area AA of the display device. The optical module may be a camera module configured to transmit and receive light through the through hole HL of the display device or a sensor module including various sensors, such as an infrared module and an ambient light sensor. In addition, each through hole HL formed through the active area AA of the display device may be used for various purposes as needed, and another module other than the optical module may be inserted into and mounted in the through hole.

Various kinds of display devices, such as a liquid crystal display and an electroluminescent display, may be applied as the display device having the through hole in the active area AA. An organic light-emitting diode (OLED) display, a quantum-dot light-emitting diode display, or an inorganic light-emitting diode display may be used as the electroluminescent display.

For example, as shown in FIG. 2A, the display device may be a liquid crystal display including a liquid crystal panel 100 and a backlight unit 110, and a cover substrate 104 may be disposed on the liquid crystal panel 100. Each through hole HL may be formed through the active area AA of the liquid crystal panel 100 and the backlight unit 110 under the liquid crystal panel 100. A camera module 160 may be inserted into each through hole HL, and may be disposed so as to overlap the cover substrate 104.

The liquid crystal panel 100 includes a first substrate in which a thin film transistor (TFT) array is disposed, a second substrate in which a color filter array is disposed, a liquid crystal layer disposed between the first and second substrates laminated by a sealant, and a polarizing plate attached to the outer surface of any one of the first and second substrates. The backlight unit 110 includes a light guide plate and a plurality of optical sheets sequentially stacked on a bottom cover under the liquid crystal panel 100, and further includes a light source disposed so as to face a light incidence surface of the light guide plate.

As another example, as shown in FIG. 2B, the display device may be an OLED display including an OLED panel 1000, and a cover substrate 104 may be disposed on the OLED panel 1000. Each through hole HL may be formed through the active area AA of the OLED panel 1000. A camera module 160 may be inserted into each through hole HL, and may be disposed so as to overlap the cover substrate 104.

The OLED panel 1000 may include a TFT array and an OLED array sequentially stacked on a substrate and an encapsulation structure disposed so as to encapsulate the OLED array and the TFT array. A touch sensor array and an optical film, such as a polarizing plate, configured to reduce reflection of external light may be further disposed on the encapsulation structure.

Figure 3:
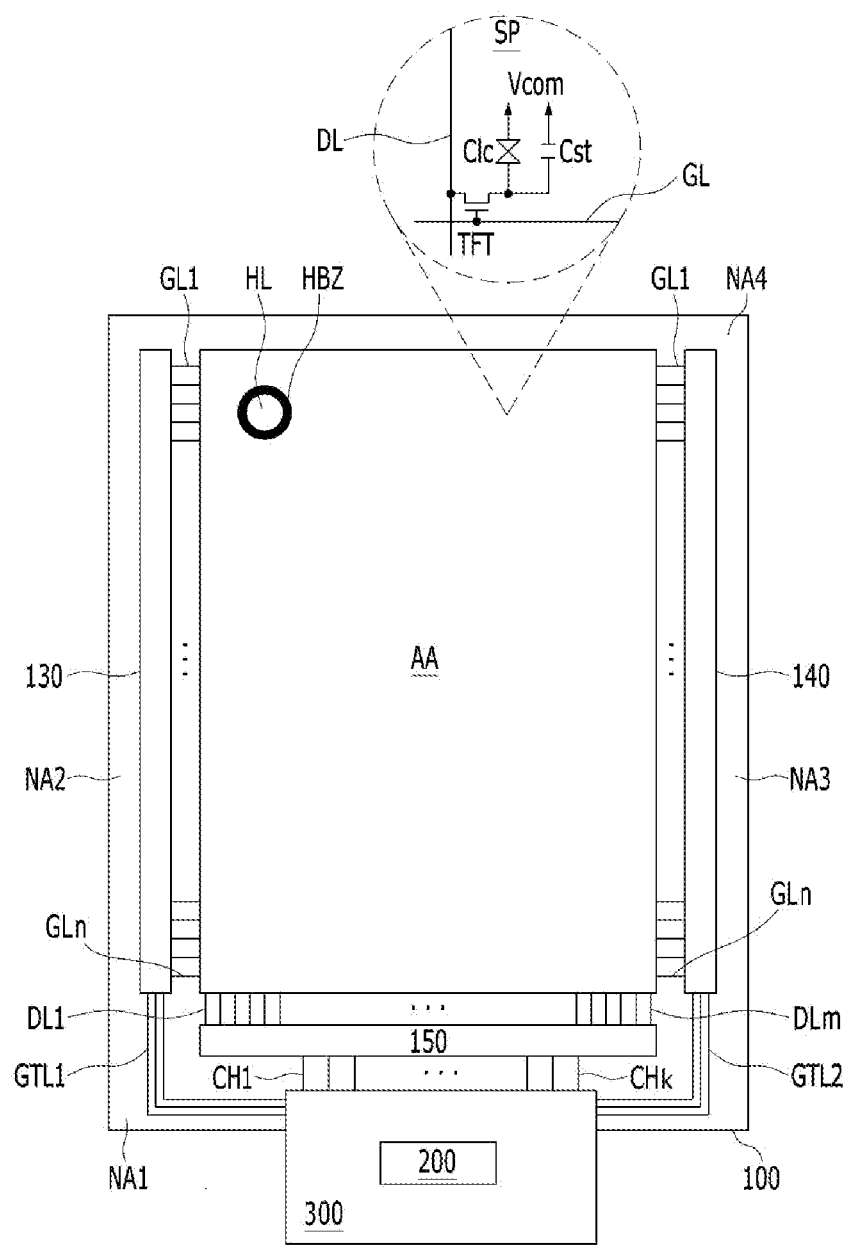
FIG. 3 is a view schematically showing the construction of a circuit of the display device according to the embodiment of the present disclosure.

FIG. 3 is a view schematically showing the construction of a circuit of the display device according to the embodiment of the present invention.

Referring to FIG. 3, the display device according to the embodiment of the present disclosure may include a liquid crystal panel 100 and a panel drive unit. The panel drive unit may include gate drivers 130 and 140 configured to drive a plurality of gate lines GL1 to GLn of the liquid crystal panel 100, a drive integrated circuit (IC) 200 configured to drive a plurality of data lines DL1 to DLm of the liquid crystal panel 100, and a demultiplexer (hereinafter referred to as DEMUX) array 150. The drive IC 200 may include a timing controller, and may control the gate drivers 130 and 140 and the DEMUX array 150.

The liquid crystal panel 100 includes an active area AA, non-active areas NA1 to NA4, at least one through hole HL formed through the active area AA, and at least one hole bezel zone HBZ surrounding the least one through hole HL in the active area AA. Meanwhile, the liquid crystal panel 100 may further include a touchscreen configured to overlap the active area AA, or a common electrode may be divided so as to be used as a touch electrode.

A plurality of subpixels constituting the active area AA may include a red subpixel, a green subpixel, and a blue subpixel, and may further include a white subpixel configured to improve luminance. Each subpixel SP includes a TFT connected to the gate line GL and the data line DL and a liquid crystal capacitor Clc and a storage capacitor Cst connected in parallel to the TFT. An amorphous silicon (a-Si) TFT, a poly-silicon (poly-Si) TFT, an oxide TFT, or an organic TFT may be used as the TFT. The liquid crystal capacitor Clc is charged with a differential voltage between a data signal supplied to a pixel electrode through the TFT and a common voltage Vcom supplied to a common electrode, and drives liquid crystals to adjust light transmittance based on the charged differential voltage. The liquid crystal layer may be driven in a twisted nematic (TN) mode, a vertical alignment (VA) mode, an in-plane switching (IPS) mode, or a fringe field switching (FFS) mode.

For example, the pixel electrode and the common electrode of each subpixel may overlap each other on a TFT array substrate in the state in which a dielectric layer is interposed therebetween, may include a plurality of slits, through which one of the pixel electrode and the common electrode overlaps the other, and may apply a fringe electric field to the liquid crystals to drive the liquid crystals. Meanwhile, the common electrode may be divided and disposed in the active area AA so as to be shared by the plurality of subpixels, and may also be used as a touch electrode.

The gate drivers 130 and 140 are constituted by a shift register disposed in the non-active areas NA2 and NA3 of the panel 100 to sequentially drive the plurality of gate lines GL1 to GLn of the active area AA. The gate drivers 130 and 140 may receive gate control signals from the drive IC 200 through transmission lines GTL1 and GTL2. The gate drivers 130 and 140 supply a scan pulse of a gate on voltage, which is a turn-on voltage of the TFT, to gate lines during a drive period of each gate line GL, and supply a gate off voltage, which is a turn-off voltage of the TFT, to gate lines during a non-drive period of each gate line GL. The gate drivers 130 and 140 may be formed on the first substrate together with a TFT array of the active area AA in the same process and thus may be disposed in the non-active areas NA2 and NA3 of the liquid crystal panel 100 in a gate in panel (GIP) type. However, the gate drivers of the display device may also be disposed in the display device in another type other than the GIP type.

For example, the first and second gate drivers 130 and 140 may be disposed in the second and third non-active areas NA2 and NA3 located at left and right sides of the active area AA to simultaneously drive the plurality of gate lines GL1 to GLn at both ends thereof, whereby it is possible to reduce RC delay of the scan pulse supplied to each gate line GL and to reduce a capacitance coupling effect. Meanwhile, only one of the first and second gate drivers 130 and 140 may be disposed in one of the second and third non-active areas NA2 and NA3, and the present disclosure is not limited thereto.

The drive IC 200 may be mounted on a circuit film 300 and may be connected to the liquid crystal panel 100 through a pad unit disposed in the first non-active area NA1 of the first substrate of the liquid crystal panel 100, or may be directly mounted on the first non-active area NA1 of the first substrate.

The drive IC 200 converts digital data, which is a video or image signal, into a positive or negative analog data signal using a plurality of gamma voltages, and outputs the converted data signal to the DEMUX array 150 through a plurality of output channels CH1 to CHk. The drive IC 200 may have a timing controller mounted therein, and may control the gate drivers 130 and 140 and the DEMUX array 150.

The DEMUX array 150 may be disposed between the drive IC 200 and the active area AA in the first non-active area NA1 of the first substrate of the liquid crystal panel 100, and may be formed on the first substrate together with the TFT array of the active area AA and the gate drivers 130 and 140 of the non-active areas NA2 and NA3 in the same process.

The DEMUX array 150 time-divides the data signal output through k output channels CH1 to CHk (k being a positive integer) of the drive IC 200 at a ratio of 1:j (j being an integer of 2 or more), and distributes the time-divided data signals to m data lines DL1 to DLm (m=k×j, m being a positive integer). In other words, the DEMUX array 150 may time-divide a data signal of each output channel CH at a ratio of 1:j in response to j control signals supplied from the drive IC 200, and may sequentially supply the j time-divided data signals to k data lines. Consequently, the number k of output channels CH1 to CHk of the drive IC 200 may be reduced by a factor of 1/j, compared to the number m of the data lines DL1 to DLm.

Figure 4:
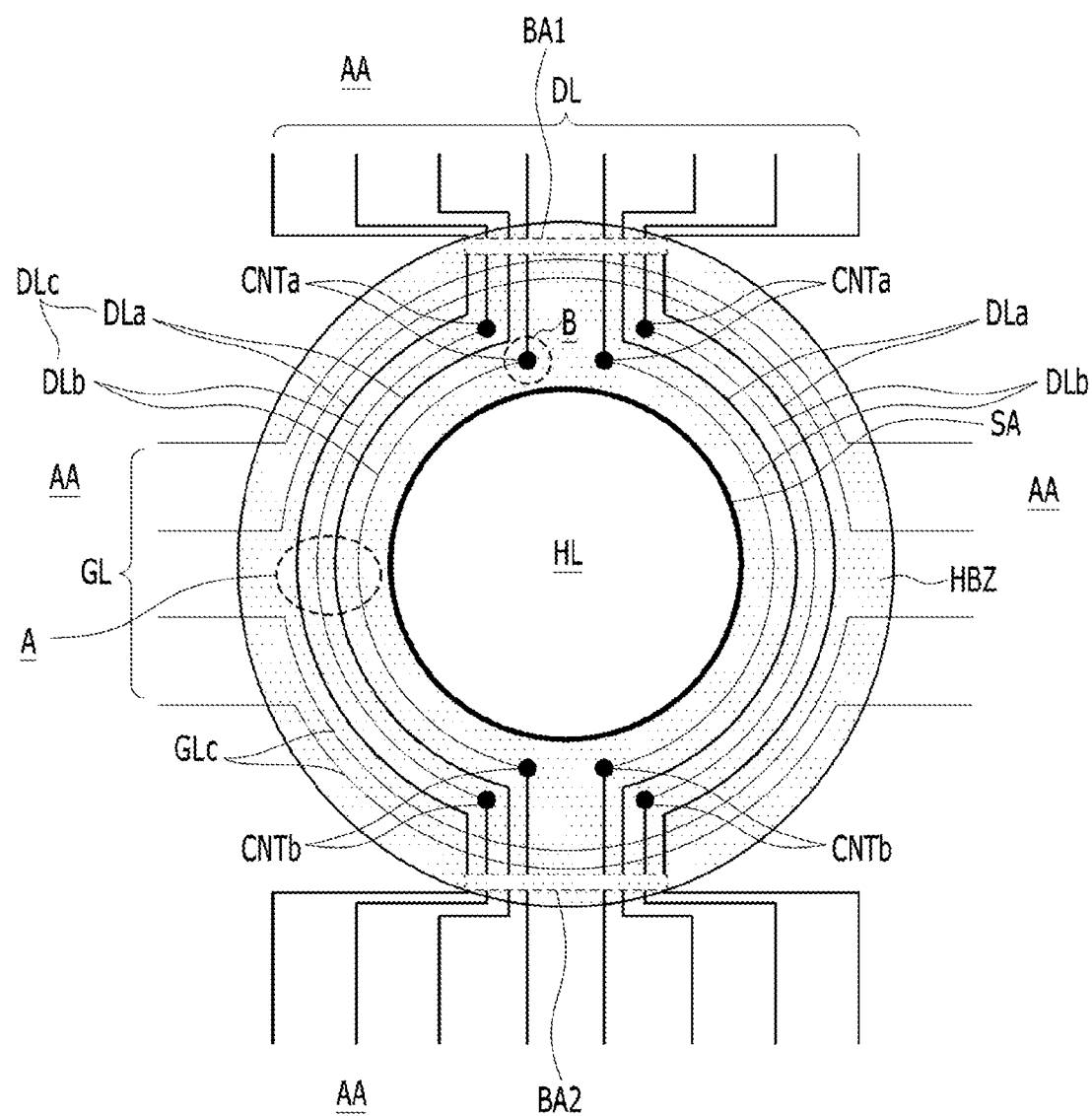
FIG. 4 is a view showing a wiring structure of a hole bezel zone according to an embodiment of the present disclosure.
Figure 5:
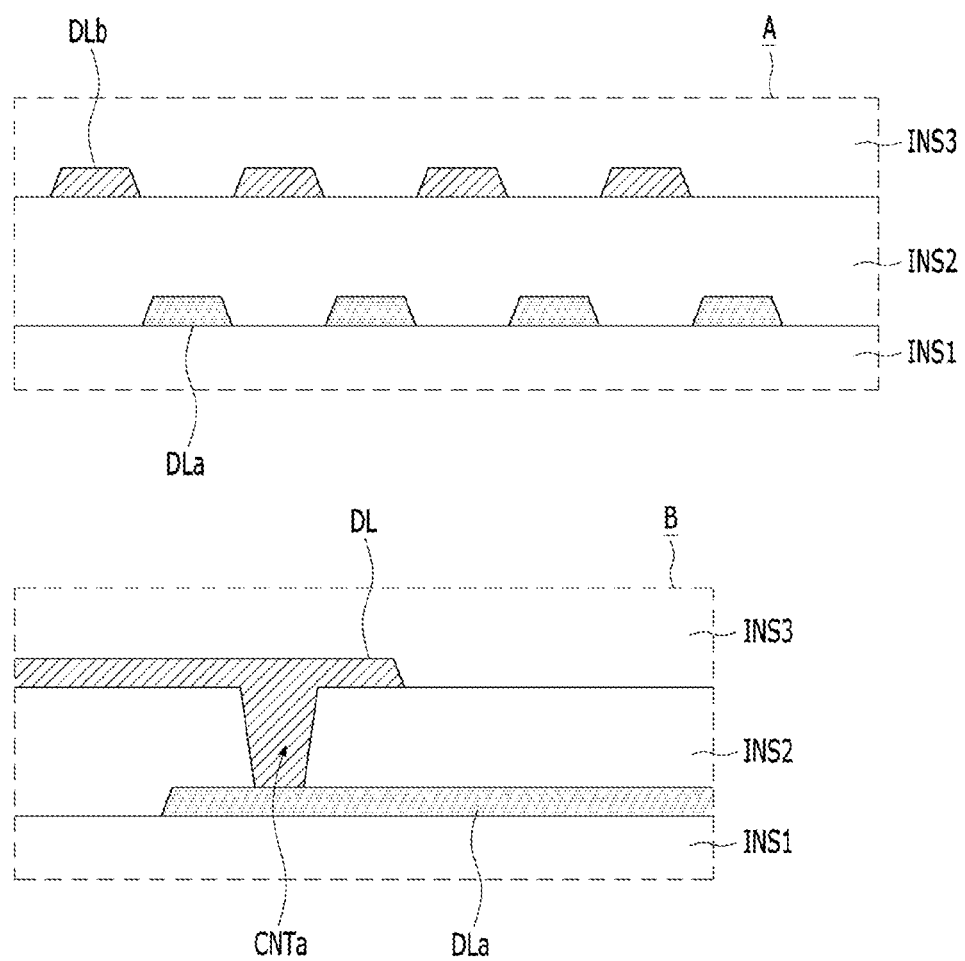
FIG. 5 is a sectional view showing the portions of the hole bezel zone according to the embodiment of the present disclosure that correspond to parts "A" and "B" shown in FIG. 4.
Figure 6:
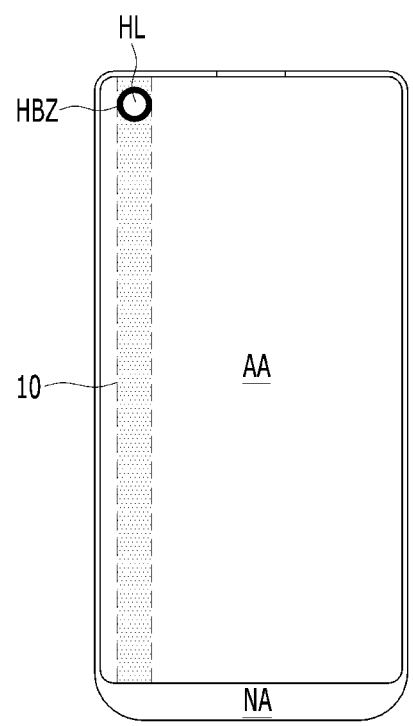
FIG. 6 is a view illustrating a vertical stain in an active area according to an embodiment of the present disclosure due to a through hole.

FIG. 4 is a view showing a wiring structure of a hole bezel zone according to an embodiment of the present disclosure, FIG. 5 is a sectional view showing the portions of the hole bezel zone that correspond to parts "A" and "B" shown in FIG. 4, and FIG. 6 is a view illustrating a vertical stain that may be seen in a display area according to an embodiment of the present disclosure.

Referring to FIG. 4, the liquid crystal panel includes a through hole HL formed through the active area AA and a ring-shaped hole bezel zone HBZ provided between the through hole HL and the active area AA, the hole bezel zone HBZ surrounding the through hole HL. A sealant SA is applied to a border between the through hole HL and the hole bezel zone HBZ along the circumference of the through hole HL in order to seal the liquid crystal layer between the first substrate and the second substrate. A black matrix is disposed on the second substrate so as to overlap wires GL, DL, DLa, and DLb disposed on the first substrate of the hole bezel zone HBZ.

Gate lines GL passing through the hole bezel zone HBZ, among a plurality of gate lines advancing in a first direction (the horizontal direction or the x-axis direction) in the active area AA, and data lines DL passing through the hole bezel zone HBZ, among a plurality of data lines in a second direction (the vertical direction or the y-axis direction) intersecting the first direction in the active area AA, are disposed in the hole bezel zone HBZ in the shape of a half arc formed around the circumference of the through hole HL.

The gate lines GL disposed in the hole bezel zone HBZ have left and right linear parts extending from left and right active areas AA respectively and advancing in the horizontal direction and curved parts GLc disposed between the left and right linear parts, each of the curved parts being formed in the shape of a half arc that is convex upwards or downwards along the circumference of the through hole HL. The linear parts and the curved parts GLc of the gate lines GL may be disposed at the outer circumferential region of the hole bezel zone HBZ that is adjacent to the active area AA.

The data lines DL disposed in the hole bezel zone HBZ have upper and lower linear parts extending from upper and lower active areas AA respectively and advancing in the vertical direction and curved parts DLc disposed between the upper and lower linear parts, each of the curved parts being formed in the shape of a half arc that is convex leftwards or rightwards along the circumference of the through hole HL. The curved parts DLc of the data lines DL may be disposed at the inner circumferential region of the hole bezel zone HBZ that is adjacent to the through hole HL so as not to overlap the gate lines GL. The linear parts of the data lines DL pass through the outer circumferential region of the hole bezel zone HBZ in the vertical direction, minimally intersect the curved parts GLc of the gate lines GL disposed at the outer circumferential region thereof, and may extend to the inner circumferential region of the hole bezel zone HBZ so as to contact the curved parts DLc of the data lines DL at the inner circumferential region thereof.

Since the disposition region (the outer circumferential region) of the gate lines GL and the disposition region (the inner circumferential region) of the curved part DLc of the data lines DL are divided from each other in the hole bezel zone HBZ, as described above, it is possible to minimize or reduce a parallel adjacent portion between the curved part GLc of each of the gate lines GL and the curved part DLc of a corresponding one of the data lines DL in the narrow hole bezel zone HBZ, whereby it is possible to reduce parasitic capacitance between the gate line GL and the data line DL.

Meanwhile, in order to maximally or increasingly secure a wire pitch of the data lines DL in the narrow hole bezel zone HBZ, the curved parts DLc of the data lines DL may be constituted by alternately forming different metal layers DLa and DLb in the state in which a dielectric film INS2 is interposed therebetween, as shown in FIG. 5.

Referring to FIGS. 4 and 5, the curved parts DLc of the data lines disposed at the inner circumference region of the hole bezel zone HBZ may have a structure in which curved parts DLa of a first metal layer on a first dielectric film INS1 and curved parts DLb of a second metal layer on a second dielectric film INS2, which covers the curved parts DLa of the first metal layer on the first dielectric film INS1, are alternately disposed, and a third dielectric film INS3 may be disposed so as to cover the curved parts DLb of the second metal layer on the second dielectric film INS2. The curved parts DLa of the first metal layer may be formed of the same gate metal layer as the gate lines GL, and the curved parts DLb of the second metal layer may be formed of the same source/drain metal layer as the data lines DL of the active area AA. The first dielectric film INS1 may be a gate dielectric film, the second dielectric film INS2 may be an interlayer dielectric film, and the third dielectric film INS3 may be a passivation film.

The curved part DLa of each data line of the first metal layer disposed at the inner circumferential region of the hole bezel zone HBZ may contact an upper linear part of the data line DL of the second metal layer located on the second dielectric film INS2 through a contact hole CNTa formed through the second dielectric film INS2, and may contact a lower linear part of the data line DL of the second metal layer located on the second dielectric film INS2 through another contact hole CNTb formed through the second dielectric film INS2.

For the data lines DL disposed in the hole bezel zone HBZ, a coupling capacitance effect may increase due to a narrower wire pitch than the active area AA, whereby signal interference may increase. As a result, charge deviation between subpixels connected to the data lines DL extending in the vertical direction (the second direction) of the active area AA and passing through the hole bezel zone HBZ and subpixels connected to the other data lines extending along the active area AA and not passing through the hole bezel zone HBZ occurs due to a difference in RC load between the data lines, and therefore a vertical stain 10 may be seen at the portion at which the subpixels are located, as shown in FIG. 6.

In order to solve this problem, in the display device according to the embodiment of the present disclosure, the arrangement sequence of the data lines DL disposed in the hole bezel zone HBZ is changed so as to be different from the active area AA through which the data lines DL pass.

Specifically, in the display device according to the embodiment of the present disclosure, the arrangement sequence of the data lines may be changed such that data lines which have the same drive timing and to which data signals having opposite polarities are applied are disposed adjacent to each other in the hole bezel zone HBZ in consideration of drive timing of the data lines DL time-division-driven by the DEMUX array 150 and the polarity of data signals, whereby it is possible to offset a coupling capacitance effect between the data lines DL in the hole bezel zone HBZ and thus to solve a stain problem.

To this end, as shown in FIG. 4, a hole bezel zone HBZ according to an embodiment of the present disclosure further includes a first bridge area BA1 disposed at the input end (one end) of the hole bezel zone HBZ adjacent to one side of the active area AA (e.g., adjacent to the active area at one side of the hole bezel zone) to change the arrangement sequence of the data lines DL and a second bridge area BA2 disposed at the output end (the other end) of the hole bezel zone HBZ adjacent to the other side of the active area AA (e.g., adjacent to the active area at the other side, e.g. opposite side, of the hole bezel zone) to restore the arrangement sequence of the data lines DL changed in the hole bezel zone HBZ so as to be the same as the active area AA.

The first and second bridge areas BA1 and BA2 of the data lines DL are disposed in the hole bezel zone HBZ so as to overlap the black matrix. The first and second bridge areas BA1 and BA2 of the data lines DL are disposed between the outer circumferential region of the hole bezel zone HBZ in which the gate lines GL are disposed and the active area AA, and do not overlap the gate lines GL, whereby it is possible to reduce parasitic capacitance between the gate lines GL and the data lines DL.

Meanwhile, the wire pitch of the gate lines GL in the hole bezel zone HBZ is reduced, compared to the active area AA. However, the gate lines GL are simultaneously driven by the first and second gate drivers 130 and 140 connected to both ends of the gate lines GL, whereby an RC time constant is small, and therefore a stain due to capacitance coupling between the gate lines is not seen.

Figure 7:
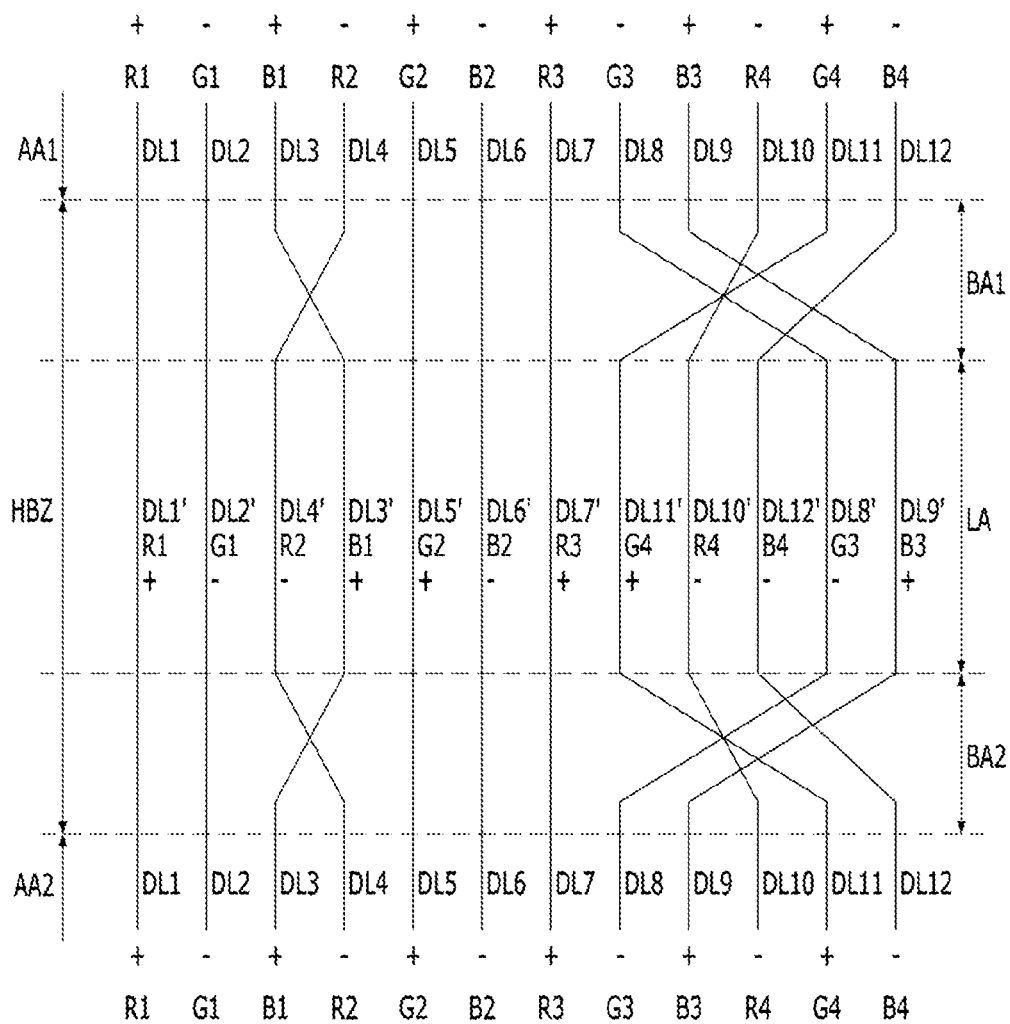
FIG. 7 is a view showing a data line change structure in the hole bezel zone compared to the active area according to the embodiment of the present disclosure.

FIG. 7 is a view showing a data line change structure (e.g., a changed arrangement sequence of the data lines) in the hole bezel zone compared to the active area according to the embodiment of the present disclosure.

FIG. 7 illustratively shows the case in which first to twelfth data lines DL1, DL2, DL3, . . . , DL12, which are data lines extending from one side active area AA1, passing through the hole bezel zone HBZ, and extending to the other side active area AA2, supply R1(+), G1(−), B1(+), R2(−), G2(+), B2(−), R3(+), G3(−), B3(+), R4(−), G4(+), and B4(−) data signals in a column inversion mode. The same will be equally applied to the following embodiments.

DL1[R1(+)], DL2[G1(−)], DL3[B1(+)], DL4[R2(−)], DL5[G2(+)], DL6[B2(−)], DL7[R3(+)], DL8[G3(−)], DL9 [B3(+)], DL10[R4(−)], DL11[G4(+)], and DL12[B4(−)] that supply R, G, and B data signals in the column inversion mode are sequentially arranged in the first and second active areas AA1 and AA2.

The arrangement sequence of some data lines may be changed through the first bridge area BA1 located at the input end of the hole bezel zone HBZ adjacent to the first active area AA1, whereby the data lines disposed in the hole bezel zone HBZ may have a disposition structure changed such that capacitance coupling between adjacent wires is offset or reduced. Each data line disposed in the hole bezel zone HBZ may be disposed at a layer different from a data line adjacent thereto, whereby the wire pitch between the data lines may be reduced. Data lines disposed adjacent to each other in a certain layer in the hole bezel zone HBZ may supply data having opposite polarities at the same timing, whereby capacitance coupling between adjacent wires may be offset. Data lines disposed adjacent to each other in another layer may supply data having opposite polarities at the same timing, whereby capacitance coupling between adjacent wires may be offset.

For example, DL3[B1(+)] and DL4[R2(−)] are disposed in the hole bezel zone HBZ in the state in which the disposition sequence thereof is changed to the disposition sequence of DL4'[R2(−)] and DL3'[B1(+)] through the first bridge area BA1, and DL8 [G3(−)], DL9 [B3(+)], DL10[R4(−)], DL11[G4(+)], and DL12[B4(−)] are disposed in the hole bezel zone HBZ in the state in which the disposition sequence thereof is changed to the disposition sequence of DL11'[G4(+)], DL10'[R4(−)], DL12'[B4(−)], DL8'[G3(−)], and DL9'[B3(+)]. In contrast, DL1[R1(+)], DL2[G1(−)], DL5[G2(+)], DL6[B2(−)], and DL7[R3(+)] are disposed in the hole bezel zone HBZ in the disposition sequence of DL1'[R1(+)], DL2'[G1(−)], DL5'[G2(+)], DL6'[B2(−)], and DL7'[R3(+)] without change.

Consequently, the data lines disposed in the hole bezel zone HBZ have a disposition structure changed to the sequence of DL1'[R1(+)], DL2'[G1(−)], DL4'[R2(−)], DL3' [B1(+)], DL5'[G2(+)], DL6'[B2(−)], DL7'[R3(+)], DL11' [G4(+)], DL10'[R4(−)], DL12'[B4(−)], DL8'[G3(−)], and DL9'[B3(+)]. Each data line disposed in the hole bezel zone HBZ and a data line adjacent thereto are disposed in different layers. DL1'[R1(+)] and DL4'[R2(−)] disposed adjacent to each other in a certain layer supply data having opposite polarities at the same timing, whereby capacitance coupling between adjacent wires is offset. DL3'[B1(+)] and DL6'[B2(−)] disposed adjacent to each other in another layer supply data having opposite polarities at the same timing, whereby capacitance coupling between adjacent wires is offset. DL7'[R3(+)] and DL10'[R4(−)] disposed adjacent to each other in the certain layer supply data having opposite polarities at the same timing, whereby capacitance coupling between adjacent wires is offset. DL12'[B4(−)] and DL9' [B3(+)] disposed adjacent to each other in the another layer supply data having opposite polarities at the same timing, whereby capacitance coupling between adjacent wires is offset.

Meanwhile, since optical efficiency of the G subpixel is relatively high and thus luminance thereof is greatly affected by coupling or other causes, adjacent data lines, such as DL2'[G1(−)], DL5'[G2(+)], DL11'[G4(+)], and DL8'[G3(−)] that supply G data signals to the hole bezel zone HBZ, driven at the same timing may maintain the same polarity by two adjacent data lines, whereby it is possible to minimize or reduce a change in polarity of adjacent data lines that supply the G data signals.

The disposition sequence of some data lines is changed to the original disposition sequence thereof through the second bridge area BA2 located at the output end of the hole bezel zone HBZ adjacent to the second active area AA2, and therefore the disposition sequence of the data lines in the second active area AA2 is identical to that in the first active area AA1.

For example, DL1'[R1(+)], DL2'[G1(−)], DL4'[R2(−)], DL3'[B1(+)], DL5'[G2(+)], DL6'[B2(−)], DL7'[R3(+)], DL11'[G4(+)], DL10'[R4(−)], DL12'[B4(−)], DL8'[G3(−)], and DL9'[B3(+)] of the hole bezel zone HBZ are disposed in the second active area AA2 in the state in which the disposition sequence thereof is changed to the disposition sequence of DL1[R1(+)], DL2[G1(−)], DL3[B1(+)], DL4 [R2(−)], DL5[G2(+)], DL6[B2(−)], DL7[R3(+)], DL8[G3 (−)], DL9[B3(+)], DL10[R4(−)], DL11[G4(+)], and DL12 [B4(−)], which is the same as the first active area AA1, through the second bridge area BA2.

Figure 8:
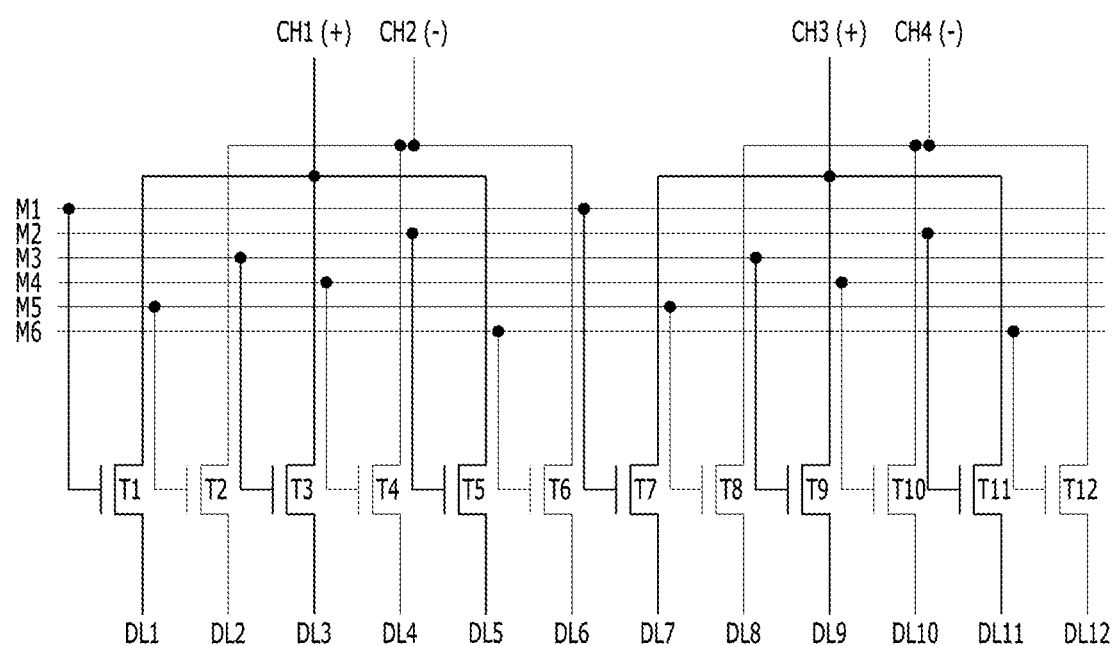
FIG. 8 is an equivalent circuit diagram showing a 1:3 DEMUX array according to an embodiment of the present disclosure.
Figure 9:
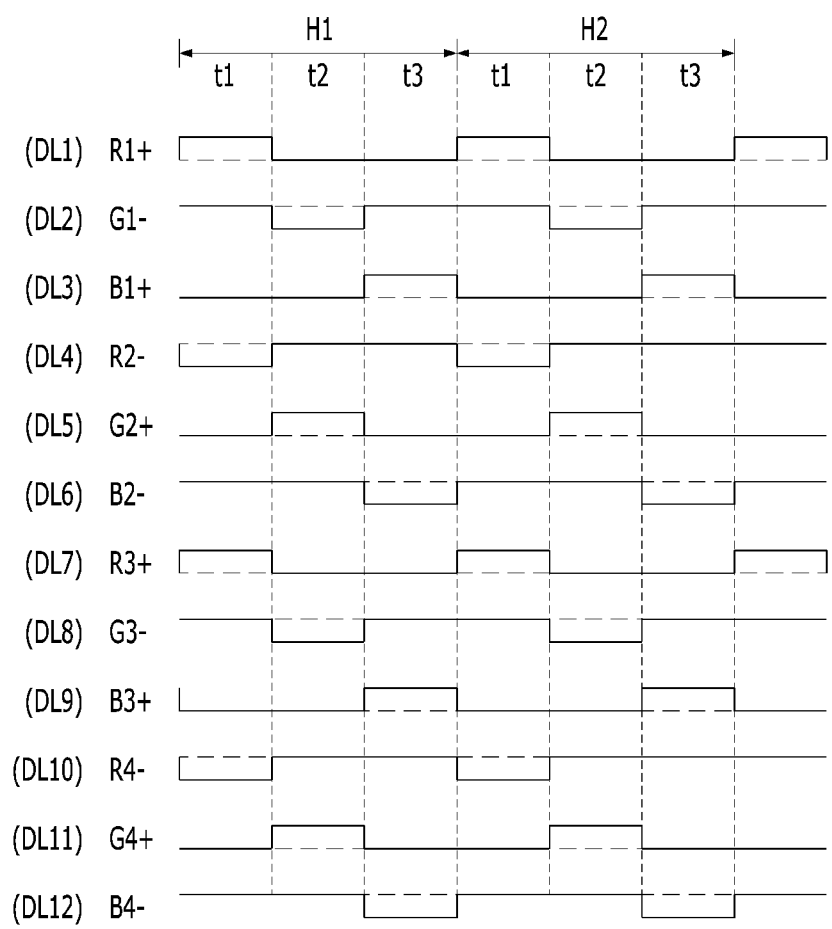
FIGS. 9 and 10 are drive waveform diagrams of data lines time-division-driven by the 1:3 DEMUX array according to the embodiment of the present disclosure in the active area and the hole bezel zone.
Figure 10:
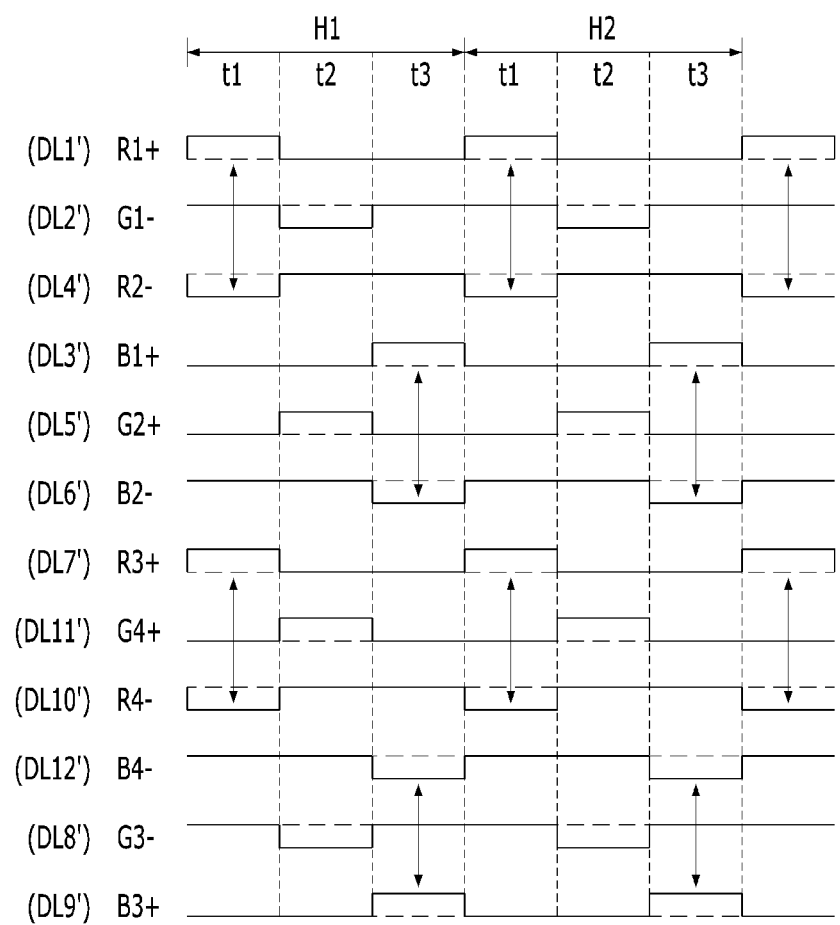

FIG. 8 is an equivalent circuit diagram showing a 1:3 DEMUX array according to an embodiment of the present disclosure, FIG. 9 is a drive waveform diagram of data lines time-division-driven by the 1:3 DEMUX array according to the embodiment of the present disclosure based on the disposition sequence in the active area, and FIG. 10 is a drive waveform diagram based on the changed disposition sequence of the data lines in the hole bezel zone.

Referring to FIGS. 8 to 10, the DEMUX array shown in FIG. 3 time-divides the outputs of four output channels CH1(+), CH2(−), CH3(+), and CH4(−) of the drive IC 200 in a ratio of 1:3 during each of horizontal periods H1 and H2 using the 1:3 DEMUX array shown in FIG. 8 so as to be distributed to twelve data lines DL1 to DL12.

Referring to FIG. 8, the 1:3 DEMUX array includes first, third, and fifth TFTs T1, T3, and T5 connected in parallel to a first output channel CH1 configured to output a positive (+) data signal, second, fourth, and sixth TFTs T2, T4, and T6 connected in parallel to a second output channel CH2 configured to output a negative (−) data signal, seventh, ninth, and eleventh TFTs T7, T9, and T11 connected in parallel to a third output channel CH3 configured to output a positive (+) data signal, and eighth, tenth, and twelfth TFTs T8, T10, and T12 connected in parallel to a fourth output channel CH4 configured to output a negative (−) data signal.

The 1:3 DEMUX array receives first to sixth control signals M1 to M6 from the drive IC 200. During each of the horizontal periods H1 and H2, first to third positive control signals M1 to M3 that control the positive TFTs T1, T3, T5, T7, T9, and T11 are sequentially enabled, and fourth to sixth negative control signals M4 to M6 that control the negative TFTs T2, T4, T6, T8, T10, and T12 are sequentially enabled in the same sequence as the first to third control signals M1 to M3.

During each of the horizontal periods H1 and H2, for time t1, the first and seventh TFTs T1 and T7 are turned on in response to the first control signal M1, and the fourth and tenth TFTs T4 and T10 are turned on in response to the fourth control signal M4. During each of the horizontal periods H1 and H2, for time t2, the fifth and eleventh TFTs T5 and T11 are turned on in response to the second control signal M2, and the second and eighth TFTs T2 and T8 are turned on in response to the fifth control signal M5. During each of the horizontal periods H1 and H2, for time t3, the third and ninth TFTs T3 and T9 are turned on in response to the third control signal M3, and the sixth and twelfth TFTs T6 and T12 are turned on in response to the sixth control signal M6.

During each of the horizontal periods H1 and H2, for time t1, the first, fourth, seventh, and tenth TFTs T1, T4, T7, and T10 turned on by the 1:3 DEMUX array in response to the first and fourth control signals M1 and M4 supply R1(+), R2(−), R3(+), and R4(−) data signals output from the drive IC 200 through the four output channels CH1, CH2, CH3, and CH4 to DL1, DL4, DL7, and DL10, respectively (FIG. 9). For time t1, in the hole bezel zone HBZ, capacitance coupling between DL1'[R1(+)] and DL4'[R2(−)] disposed adjacent to each other in the same layer by the changed structure may be offset due to opposite polarities thereof, and capacitance coupling between DL7'[R3(+)] and DL10' [R4(−)] disposed adjacent to each other may be offset due to opposite polarities of red data signals having the same color (FIG. 10).

During each of the horizontal periods H1 and H2, for time t2, the second, fifth, eighth, and eleventh TFTs T2, T5, T8, and T11 turned on by the 1:3 DEMUX array in response to the second and fifth control signals M2 and M5 supply G1(−), G2(+), G3(−), and G4(+) data signals output from the drive IC 200 through the four output channels CH1, CH2, CH3, and CH4 to DL2, DL5, DL8, and DL11, respectively (FIG. 9). For time t2, in the hole bezel zone HBZ, adjacent data lines, such as DL2'[G1(−)], DL5'[G2(+)], DL11'[G4 (+)], and DL8'[G3(−)], may maintain the same polarity of green data signals having the same color by two adjacent data lines, whereby it is possible to minimize or reduce a change in polarity.

During each of the horizontal periods H1 and H2, for time t3, the third, sixth, ninth, and twelfth TFTs T3, T6, T9, and T11 turned on by the 1:3 DEMUX array in response to the third and sixth control signals M3 and M6 supply B1(+), B2(−), B3(+), and B4(−) data signals output from the drive IC 200 through the four output channels CH1, CH2, CH3, and CH4 to DL3, DL6, DL9, and DL11, respectively (FIG. 9). For time t3, in the hole bezel zone HBZ, capacitance coupling between DL3'[B1(+)] and DL6'[B2(−)] disposed adjacent to each other in the same layer by the changed structure may be offset due to opposite polarities of blue data signals having the same color, and capacitance coupling between DL12'[B4(−)] and DL9'[B3(+)] disposed adjacent to each other may be offset due to opposite polarities thereof (FIG. 10).

Figure 11:
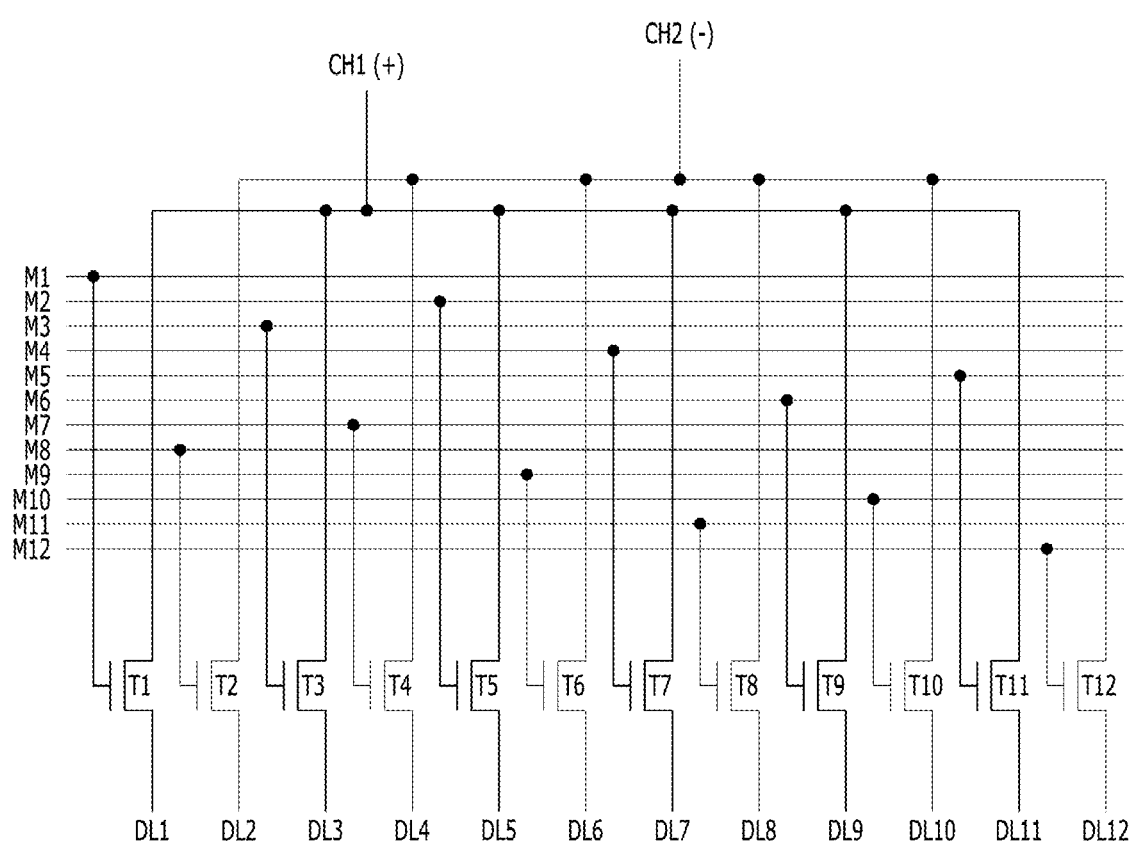
FIG. 11 is an equivalent circuit diagram showing a 1:6 DEMUX array according to an embodiment of the present disclosure.
Figure 12:
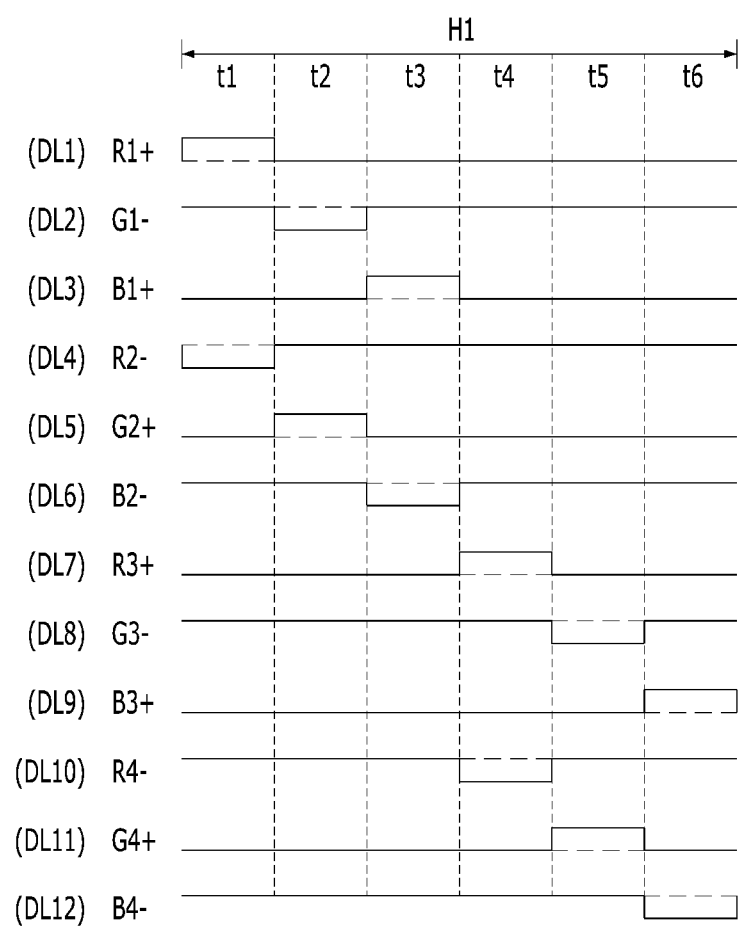
FIGS. 12 and 13 are drive waveform diagrams of data lines time-division-driven by the 1:6 DEMUX array according to the embodiment of the present disclosure in the active area and the hole bezel zone.
Figure 13:
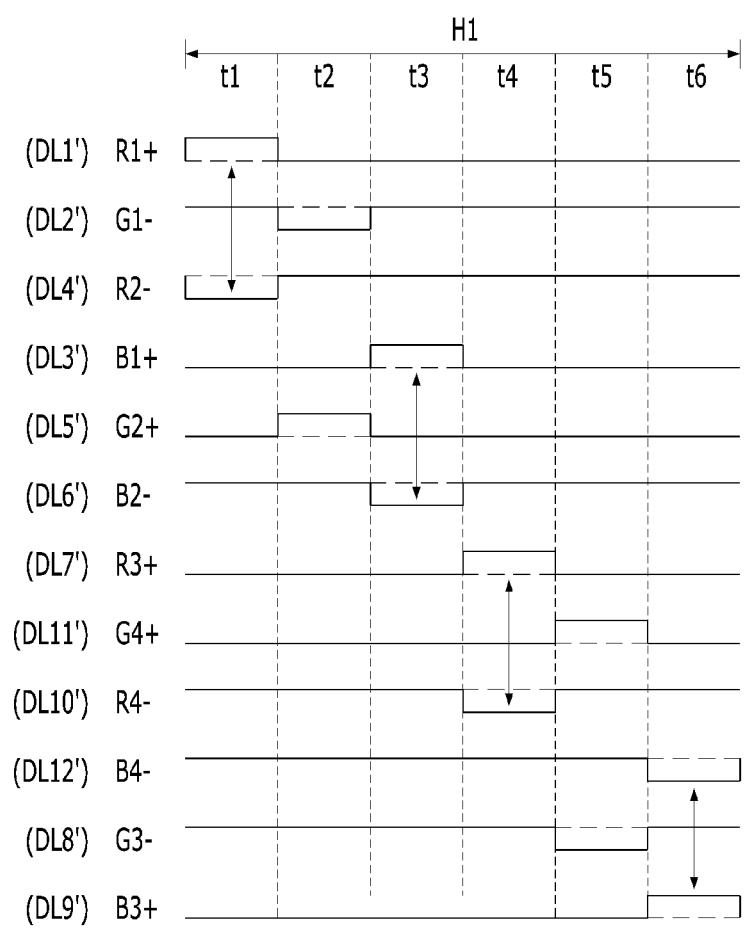

FIG. 11 is an equivalent circuit diagram showing a 1:6 DEMUX array according to an embodiment of the present disclosure, FIG. 12 is a drive waveform diagram of data lines time-division-driven by the 1:6 DEMUX array according to the embodiment of the present disclosure based on the disposition sequence in the active area, and FIG. 13 is a drive waveform diagram based on the changed disposition sequence of the data lines in the hole bezel zone.

Referring to FIGS. 11 to 13, the DEMUX array shown in FIG. 3 time-divides the output of two output channels CH1(+) and CH2(−) of the drive IC 200 in a ratio of 1:6 during a horizontal period H1 using the 1:6 DEMUX array shown in FIG. 11 so as to be distributed to twelve data lines DL1 to DL12.

Referring to FIG. 11, the 1:6 DEMUX array includes first, third, fifth, seventh, ninth, and eleventh TFTs T1, T3, T5, T7, T9, and T11 connected in parallel to a first output channel CH1 configured to output a positive (+) data signal and second, fourth, sixth, eighth, tenth, and twelfth TFTs T2, T4, T6, T8, T10, and T12 connected in parallel to a second output channel CH2 configured to output a negative (−) data signal.

The 1:6 DEMUX array receives first to twelfth control signals M1 to M12 from the drive IC 200. During the horizontal period H1, first to sixth positive control signals M1 to M6 that control the positive TFTs T1, T3, T5, T7, T9, and T11 are sequentially enabled, and seventh to twelfth negative control signals M7 to M12 that control the negative TFTs T2, T4, T6, T8, T10, and T12 are sequentially enabled in the same sequence as the first to sixth positive control signals M1 to M6.

During the horizontal period H1, for time t1, the first and fourth TFTs T1 and T4 are turned on in response to the first and seventh control signals M1 and M7. During the horizontal period H1, for time t2, the fifth and second TFTs T5 and T2 are turned on in response to the second and eighth control signals M2 and M8. During the horizontal period H1, for time t3, the third and sixth TFTs T3 and T6 are turned on in response to the third and ninth control signals M3 and M9. During the horizontal period H1, for time t4, the seventh and tenth TFTs T7 and T10 are turned on in response to the fourth and tenth control signals M4 and M10. During the horizontal period H1, for time t5, the eleventh and eighth TFTs T11 and T8 are turned on in response to the fifth and eleventh control signals M5 and M11. During the horizontal period H1, for time t6, the ninth and twelfth TFTs T9 and T12 are turned on in response to the sixth and twelfth control signals M6 and M12.

During the horizontal period H1, for time t1, the first and fourth TFTs T1 and T4 turned on by the 1:6 DEMUX array in response to the first and seventh control signals M1 and M7 supply R1(+) and R2(−) data signals output from the drive IC 200 through the two output channels CH1 and CH2 to DL1 and DL4 of the active area AA, respectively (FIG. 12). For time t1, in the hole bezel zone HBZ, capacitance coupling between DL1'[R1(+)] and DL4'[R2(−)] disposed adjacent to each other in the same layer by the changed structure may be offset due to opposite polarities of red data signals having the same color (FIG. 13).

During the horizontal period H1, for time t2, the second and fifth TFTs T2 and T5 turned on by the 1:6 DEMUX array in response to the eighth and second control signals M8 and M2 supply G1(−) and G2(+) data signals output from the drive IC 200 through the two output channels CH1 and CH2 to DL2 and DL5 of the active area AA, respectively (FIG. 12). For time t2, in the hole bezel zone HBZ, capacitance coupling between DL2'[G1(−)] and DL5'[G2(+)] disposed adjacent to each other in different layers may also be offset due to opposite polarities of green data signals having the same color (FIG. 13).

During the horizontal period H1, for time t3, the third and sixth TFTs T3 and T6 turned on by the 1:6 DEMUX array in response to the third and ninth control signals M3 and M9 supply B1(+) and B2(−) data signals output from the drive IC 200 through the two output channels CH1 and CH2 to DL3 and DL6 of the active area AA, respectively (FIG. 12). For time t3, in the hole bezel zone HBZ, capacitance coupling between DL3'[B1(+)] and DL6'[B2(−)] disposed adjacent to each other in the same layer by the changed structure may be offset due to opposite polarities of blue data signals having the same color (FIG. 13).

During the horizontal period H1, for time t4, the seventh and tenth TFTs T7 and T10 turned on by the 1:6 DEMUX array in response to the fourth and tenth control signals M4 and M10 supply R3(+) and R4(−) data signals output from the drive IC 200 through the two output channels CH1 and CH2 to DL7 and DL10 of the active area AA, respectively (FIG. 12). For time t4, in the hole bezel zone HBZ, capacitance coupling between DL7'[R3(+)] and DL10'[R4(−)] disposed adjacent to each other in the same layer by the changed structure may be offset due to opposite polarities of red data signals having the same color (FIG. 13).

During the horizontal period H1, for time t5, the eighth and eleventh TFTs T8 and T11 turned on by the 1:6 DEMUX array in response to the eleventh and fifth control signals M11 and M5 supply G3(−) and G4(+) data signals output from the drive IC 200 through the two output channels CH1 and CH2 to DL8 and DL11 of the active area AA, respectively (FIG. 12). For time t5, in the hole bezel zone HBZ, capacitance coupling between DL11'[G4(+)] and DL8'[G3(−)] disposed adjacent to each other in different layers may also be offset due to opposite polarities of green data signals having the same color (FIG. 13).

During the horizontal period H1, for time t6, the ninth and twelfth TFTs T9 and T12 turned on by the 1:6 DEMUX array in response to the sixth and twelfth control signals M6 and M12 supply B3(+) and B4(−) data signals output from the drive IC 200 through the two output channels to DL9 and DL12 of the active area AA, respectively (FIG. 12). For time t6, in the hole bezel zone HBZ, capacitance coupling between DL12'[B4(−)] and DL9'[B3(+)] disposed adjacent to each other in the same layer by the changed structure may be offset due to opposite polarities of blue data signals having the same color (FIG. 13).

Figure 14:
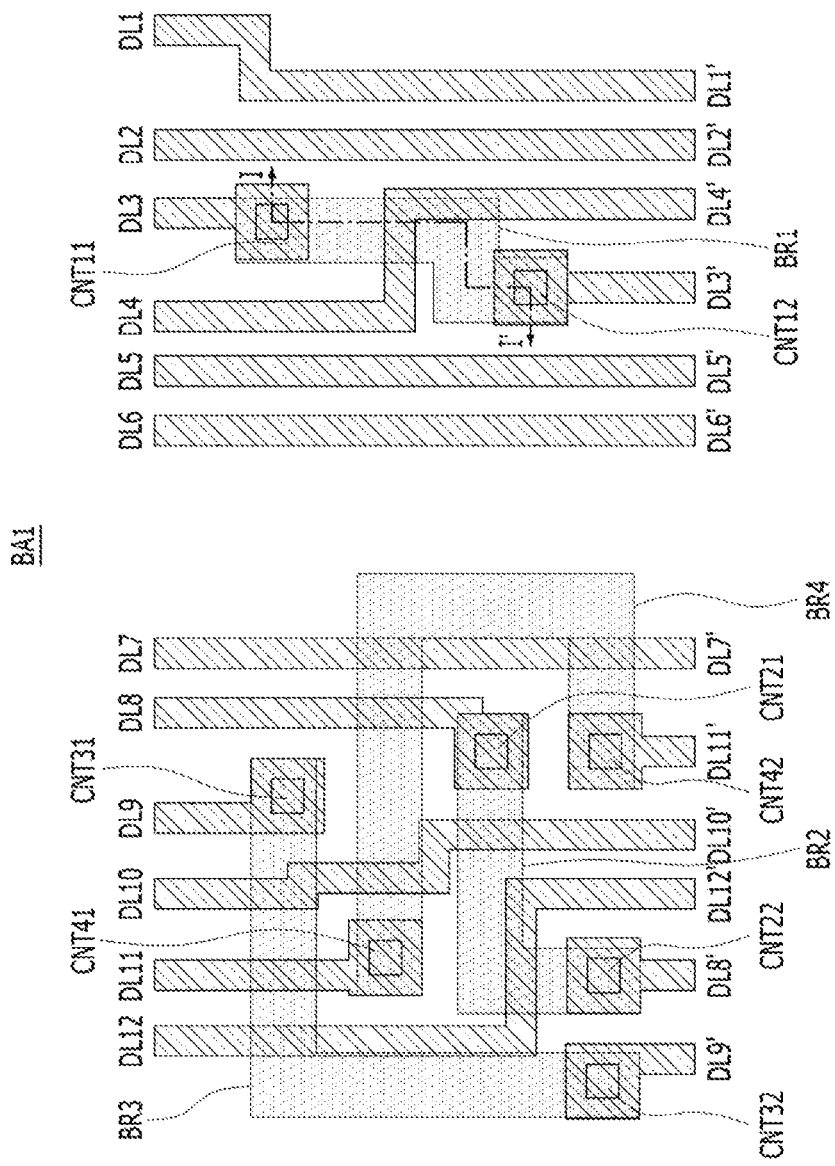
FIG. 14 is a plan view showing a wiring structure of a bridge area of the hole bezel zone according to the embodiment of the present disclosure.
Figure 15:
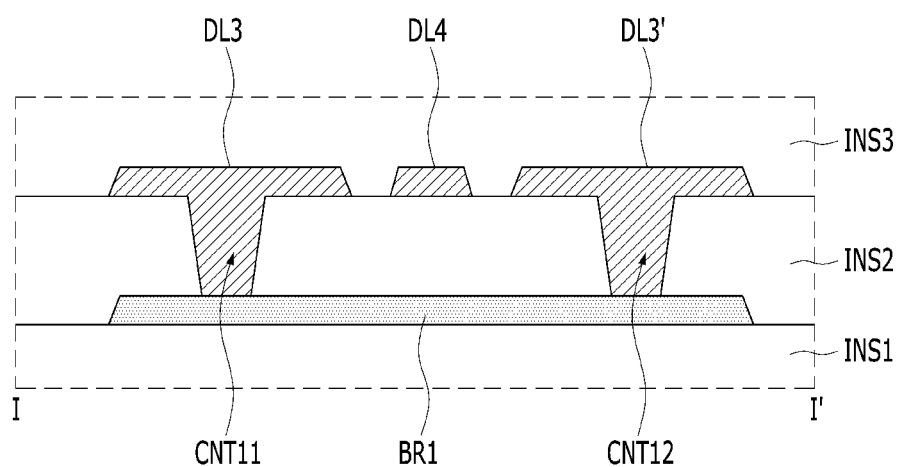
FIG. 15 is a sectional view of the bridge area according to the embodiment of the present disclosure taken along line I-I' of FIG. 14.

FIG. 14 is a plan view showing a wiring structure of a bridge area of the hole bezel zone according to the embodiment of the present disclosure, and FIG. 15 is a sectional view of the bridge area according to the embodiment of the present disclosure taken along line I-I' of FIG. 14.

FIG. 14 shows the wiring structure of the first bridge area BA1 of the hole bezel zone according to the embodiment of the present disclosure, wherein DL1 to DL12 extending from the active area AA may be sequentially disposed in the leftward direction from the right.

Referring to FIGS. 14 and 15, DL1, DL2, DL5, DL6, and DL7 extending from the active area extend to DL1', DL2', DL5', DL6', and DL7' of the hole bezel zone HBZ while the arrangement sequence thereof is maintained in the bridge area BA1 of the hole bezel zone HBZ.

DL3 extending from the active area is connected to a bridge electrode BR1 disposed in another layer through a contact hole CNT11 of a dielectric film INS2 in the bridge area BA1 of the hole bezel zone HBZ, and the bridge electrode BR1 is connected to DL3' disposed between DL4' and DL5' in the hole bezel zone HBZ through a contact hole CNT12 of the dielectric film INS2. DL4 extending from the active area intersects the bridge electrode BR1 in the state in which the dielectric film INS2 is interposed therebetween, and is connected to DL4' disposed between DL2' and DL3' in the hole bezel zone HBZ.

DL8 extending from the active area is connected to a bridge electrode BR2 disposed in another layer through a contact hole CNT21 of the dielectric film INS2 in the bridge area BA1 of the hole bezel zone HBZ, and the bridge electrode BR2 is connected to DL8' disposed between DL12' and DL9' in the hole bezel zone HBZ through a contact hole CNT22 of the dielectric film INS2.

DL9 extending from the active area is connected to a bridge electrode BR3 disposed in another layer through a contact hole CNT31 of the dielectric film INS2 in the bridge area BA1 of the hole bezel zone HBZ, and the bridge electrode BR3 is connected to DL9' disposed after DL8' in the hole bezel zone HBZ through a contact hole CNT32 of the dielectric film INS2.

DL10 extending from the active area intersects a plurality of bridge electrodes BR3, BR4, and BR2 in the state in which the dielectric film INS2 is interposed therebetween in the bridge area BA1 of the hole bezel zone HBZ, and is connected to DL10' disposed between DL11' and DL12' in the hole bezel zone HBZ.

DL11 extending from the active area is connected to the bridge electrode BR4 disposed in another layer through the contact hole CNT41 of the dielectric film INS2 in the bridge area BA1 of the hole bezel zone HBZ, and the bridge electrode BR4 is connected to DL11' disposed between DL7' and DL10' in the hole bezel zone HBZ through the contact hole CNT42 of the dielectric film INS2.

DL12 extending from the active area intersects the plurality of bridge electrodes BR3 and BR2 in the state in which the dielectric film INS2 is interposed therebetween in the bridge area BA1 of the hole bezel zone HBZ, and is connected to DL12' disposed between DL10' and DL8' in the hole bezel zone HBZ.

As is apparent from the above description, in a display device according to an embodiment of the present disclosure, data lines which have the same drive timing and to which data signals having opposite polarities are applied are disposed adjacent to each other in a hole bezel zone having a narrow wire pitch in consideration of drive timing of data lines time-division-driven by a DEMUX array and the polarity of data signals, whereby it is possible to reduce coupling capacitance effect due to the narrow wire pitch through offset compensation. As a result, it is possible to compensate for signal interference between the data lines due to the narrow wire pitch in the hole bezel zone, whereby it is possible to reduce a vertical stain in an active area due to a through hole and thus to improve image quality.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
a panel comprising an active area in which a plurality of subpixels is disposed;
a through hole formed through the active area of the panel;
a hole bezel zone disposed between the through hole and the active area so as to surround the through hole; and
a plurality of data lines extending from a first active area of the active area to a second active area of the active area via the hole bezel zone, the plurality of data lines having a smaller wire pitch in the hole bezel zone than in the first active area and the second active area,
wherein a first arrangement sequence of the plurality of data lines disposed in the first active area and a second arrangement sequence of the plurality of data lines disposed in the hole bezel zone are different from each other, and wherein
the plurality of data lines is time-division-driven by a demultiplexer array mounted in the panel, and
the second arrangement sequence of the plurality of data lines in the hole bezel zone is set such that data lines among the time-division-driven data lines, which have identical drive timing and to which data signals having opposite polarities are applied, are disposed adjacent to each other,
wherein data lines that apply green data signals in the hole bezel zone apply data signals having an identical polarity by two adjacent data lines.

2. The display device according to claim 1, wherein the hole bezel zone comprises:
a first bridge area disposed at an input end of the hole bezel zone adjacent to the first active area to change the first arrangement sequence of the plurality of data lines to the second arrangement sequence; and
a second bridge area disposed at an output end of the hole bezel zone adjacent to the second active area to change the second arrangement sequence of the plurality of data lines to the first arrangement sequence.

3. The display device according to claim 2, wherein
an arrangement sequence of the plurality of data lines is changed such that:
the plurality of data lines has the first arrangement sequence in which a first data line to a twelfth data line are sequentially arranged in each of the first active area and the second active area, and
the plurality of data lines has the second arrangement sequence in which the data lines are arranged in order of the first, second, fourth, third, fifth, sixth, seventh, eleventh, tenth, twelfth, eighth, and ninth data lines in the hole bezel zone.

4. The display device according to claim 3, wherein each of the first bridge area and the second bridge area further comprises:
a first bridge electrode configured to interconnect the third data line extending from the active area and the third data line having the second arrangement sequence in the hole bezel zone;
a second bridge electrode configured to interconnect the eighth data line extending from the active area and the eighth data line having the second arrangement sequence in the hole bezel zone;
a third bridge electrode configured to interconnect the ninth data line extending from the active area and the ninth data line having the second arrangement sequence in the hole bezel zone; and a fourth bridge electrode configured to interconnect the eleventh data line extending from the active area and the eleventh data line having the second arrangement sequence in the hole bezel zone.

5. The display device according to claim 2, wherein the hole bezel zone comprises:

an outer circumferential region in which a plurality of gate lines extending from a third active area of the active area to a fourth active area of the active area via the hole bezel zone are disposed; and an inner circumferential region in which curved parts of the plurality of data lines are disposed along the through hole between the outer circumferential region and the through hole, and wherein the first bridge area is disposed between the first active area and the outer circumferential region and the second bridge area is disposed between the second active area and the outer circumferential region.

6. The display device according to claim 2, wherein the display device is a liquid crystal display device, and the first bridge area and the second bridge area are disposed to overlap a black matrix of the liquid crystal display device.

7. The display device according to claim 1, wherein the plurality of data lines comprises data lines of a first metal layer and data lines of a second metal layer disposed in the hole bezel zone, the data lines of the first metal layer and the data lines of the second metal layer being alternately disposed.

8. The display device according to claim 7, wherein adjacent data lines of the first metal layer disposed adjacent to each other in a state in which the data lines of the second metal layer are disposed therebetween in the hole bezel zone have the identical drive timing and are applied with the data signals having opposite polarities.

9. The display device according to claim 7, wherein adjacent data lines of the second metal layer disposed adjacent to each other in a state in which the data lines of the first metal layer are disposed therebetween in the hole bezel zone have the identical drive timing and apply the data signals having opposite polarities.

10. The display device according to claim 7, wherein a dielectric film is interposed between the first metal layer and the second metal layer.

11. The display device according to claim 1, wherein the data signals having the opposite polarities are data signals of an identical color.

12. The display device according to claim 1, wherein the plurality of data lines is time-division-driven at a ratio of 1:3 during each horizontal period, wherein in the hole bezel zone, during each horizontal period, for a first time, a first data line and a fourth data line disposed adjacent to each other in an identical layer supply a first red data signal and a second red data signal having opposite polarities, respectively, and a seventh data line and a tenth data line disposed adjacent to each other in an identical layer supply a third red data signal and a fourth red data signal having opposite polarities, respectively, during each horizontal period, for a second time, a second data line and a fifth data line disposed in different layers supply a first green data signal and a second green data signal having opposite polarities, respectively, and an eleventh data line and an eighth data line disposed in different layers supply a fourth green data signal and a third green data signal having opposite polarities, respectively, the polarities of the second green data signal and the fourth green data signal being identical, and during each horizontal period, for a third time, a third data line and a sixth data line disposed adjacent to each other in an identical layer supply a first blue data signal and a second blue data signal having opposite polarities, respectively, and a twelfth data line and a ninth data line disposed adjacent to each other in an identical layer supply a fourth blue data signal and a third blue data signal having opposite polarities, respectively.

13. The display device according to claim 1, wherein the plurality of data lines is time-division-driven at a ratio of 1:6 during each horizontal period, wherein in the hole bezel zone, during each horizontal period, for a first time, a first data line and a fourth data line disposed adjacent to each other in an identical layer supply a first red data signal and a second red data signal having opposite polarities, respectively, during each horizontal period, for a second time, a second data line and a fifth data line disposed in different layers supply a first green data signal and a second green data signal having opposite polarities, respectively, during each horizontal period, for a third time, a third data line and a sixth data line disposed adjacent to each other in an identical layer supply a first blue data signal and a second blue data signal having opposite polarities, respectively, during each horizontal period, for a fourth time, a seventh data line and a tenth data line disposed adjacent to each other in an identical layer supply a third red data signal and a fourth red data signal having opposite polarities, respectively, during each horizontal period, for a fifth time, an eleventh data line and an eighth data line disposed in different layers supply a fourth green data signal and a third green data signal having opposite polarities, respectively, and during each horizontal period, for a sixth time, a twelfth data line and a ninth data line disposed adjacent to each other in an identical layer supply a fourth blue data signal and a third blue data signal having opposite polarities, respectively.

14. The display device of claim 1, wherein no subpixel is disposed in the hole bezel zone.

15. The display device of claim 1, wherein an optical module is inserted into the through hole.

* * * * *